(12) United States Patent
Hsieh

(10) Patent No.: US 8,854,790 B1
(45) Date of Patent: Oct. 7, 2014

(54) ELECTROSTATIC CHUCK ASSEMBLY

(75) Inventor: David Hsieh, Kaohsiung (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/127,084

(22) Filed: Apr. 22, 2002

(51) Int. Cl.
*H02N 13/00* (2006.01)
*H05H 1/00* (2006.01)

(52) U.S. Cl.
USPC ............................................ 361/234; 156/345

(58) Field of Classification Search
USPC .................. 361/234; 118/87; 438/87; 219/87; 156/345
See application file for complete search history.

(56) References Cited

U.S. PATENT DOCUMENTS 6,117,349 A * 9/2000 Huang et al. ............... 156/345.3
6,284,093 B1 * 9/2001 Ke et al. .................... 156/345.51

* cited by examiner

*Primary Examiner* — Stephen W. Jackson
*Assistant Examiner* — Boris Benenson
(74) *Attorney, Agent, or Firm* — Tung & Associates

(57) ABSTRACT

The present invention generally relates to an electrostatic chuck assembly for uniformly processing a wafer in a semiconductor wafer processing process, more particularly to prevent a byproduct formed from leakage of wafer processing materials from depositing between a wafer and the electrostatic chuck assembly.

The electrostatic chuck assembly has a wafer holding member for holding a wafer; a shadow ring in engagement with the wafer holding member; and an insert ring disposed between the shadow ring and the wafer holding member.

The wafer holding member has a wafer mounting surface and may preferably have a conical head having a tapered peripheral wall and a cylindrical portion. Alternatively, the wafer holding member is cylindrical and extends downwardly from the wafer mounting surface. The insert ring has an inner wall for sealably engaging the wafer holding member and preferably, is removable to allow for easy cleaning of the electrostatic chuck assembly.

15 Claims, 4 Drawing Sheets

ELECTROSTATIC CHUCK ASSEMBLY

FIELD OF THE INVENTION

The present invention generally relates to an electrostatic chuck assembly for uniformly processing a wafer in a semiconductor wafer processing process, more particularly to prevent a byproduct formed from leakage of wafer processing materials from depositing between a wafer and the electrostatic chuck assembly.

BACKGROUND OF THE INVENTION

In a semiconductor production process, an electrostatic chuck, is used to hold a wafer in a processing chamber of a CVD apparatus for forming a thin film on a semiconductor wafer, a dry etching apparatus for micromachining the wafer, or the like. In the fabrication of modern integrated circuit devices, one of the key requirements is the ability to construct plugs or interconnects in reduced dimensions such that they may be used in a multi-level metalization structure. The numerous processing steps involved require the formation of via holes for the plug or interconnect in a dimension of 0.5 μm or less for use in high-density logic devices. For instance, in forming tungsten plugs by a chemical vapor deposition method, via holes in such small dimensions must be formed by etching through layers of oxide and spin-on-glass materials at a high etch rate. A high-density plasma etching process utilizing a fluorine chemistry is frequently used in the via formation process.

In a modern etch chamber, an electrostatic wafer holding device, i.e., an electrostatic chuck or commonly known as an E-chuck, is frequently used where the chuck electrostatically attracts and holds a wafer that is positioned on top. The E-chuck holding method is highly desirable in the vacuum handling and processing of wafers. In contrast to a conventional method of holding wafers by mechanical clamping means where only slow movement is allowed during wafer handling, an E-chuck device can hold and move wafers with a force equivalent to several tens of Torr pressure.

Electrostatic chucking is a technique used to secure a wafer onto a susceptor in a wafer processing chamber. In more recently developed wafer processing technology, the electrostatic wafer holding technique is frequently employed in which an E-chuck electrostatically attracts and holds the wafer. It is a highly desirable technique used in the vacuum handling and processing of silicon wafers. In contrast to a conventional method of holding wafers by either gravity or mechanical clamping means only slow motion of the susceptor is allowed during wafer handling, an electrostatic wafer holding device can hold wafers with a force that is significantly higher.

Electrostatic chucks have been used to overcome the non-uniform clamping associated with mechanical clamping devices. The electrostatic chuck utilizes the attractive coulomb force between oppositely charged surfaces to clamp together an article and a chuck. It is generally recognized that in an electrostatic chuck, the force between the wafer and the chuck is uniform for a flat wafer and a flat chuck. This is in contrast to a mechanical clamping system where the clamping is effected around the peripheral of a wafer. Special provisions must be made to compensate for the bowing at the center of the wafer caused by the pressure of cooling gas which is pumped in between the wafer and the pedestal that is supporting and cooling the wafer. For instance, in order to compensate for the bowing of the wafer, one solution is to make the pedestal in a domed or bowed shape. Bowing is substantially eliminated in an electrostatic chuck where the wafer is held on a substantially planar chuck surface with an even electrostatic force distributed according to the electrode layout. The electrostatic force may prevent bowing of the wafer and thus, promote uniform heat transfer over the entire wafer surface.

In the normal operation of an electrostatic chuck, one or more electrodes formed in the chuck body induce an electrostatic charge on the surface of a dielectric material that is coated over the chuck surface facing the wafer, i.e., between the bottom surface of the wafer and the top surface of the chuck. A typical surface of the dielectric material that can be used for such purpose is, for instance, a polyamide or ceramic material. The electrostatic force between the wafer and the chuck is proportional to the square of the voltage between them and to the dielectric constant of the dielectric layer, and inversely proportional to the square of the distance between the wafer and the chuck, i.e., $$\text{Electrostatic Chucking Force} = k(V/D)^2$$

wherein k is the dielectric constant of the dielectric layer. V is the voltage drop across the dielectric film, and d is the thickness of the dielectric layer. The charging/discharging time constant is RC. When R is very large for a thick oxide backing layer (i.e., d is very large), the electrostatic chucking force can be greatly reduced causing the electrostatic chucking of the wafer to fail.

Since the principal of electrostatic chucking is that there must exist an attractive force between two parallel plates, i.e., between the silicon wafer and the susceptor that have opposite electrical charges, the chucking efficiency is not only determined by the bias voltage, the electric constant of the system, the effective distance between the two parallel plates, but also determined by the wafer grounding efficiency. To utilize electrostatic chucking efficiently in a wafer processing chamber, the surface of the wafer should be electrically conductive so that it can be properly grounded.

A typical inductively coupled plasma etch chamber 10 is shown in FIG. 1. In the etch chamber 10, which is similar to a Lam TCP® etcher made by the Lam Research Corp., the plasma source is a transformer-coupled plasma source which generates high-density, low-pressure plasma 12 decoupled from the wafer 14. The plasma source allows independent control of ion flux and ion energy. Plasma 12 is generated by a flat spiral coil 16, i.e., an inductive coil, which is separated from the plasma by a dielectric plate 18, or a dielectric window on top of the reactor chamber 20. The wafer 14 is positioned away from the coil 16 so that it is not affected by the electromagnetic field generated by the coil 16. There is very little plasma density loss because plasma 12 is generated only a few mean free paths away from the wafer surface. The Lam TCP® plasma etcher therefore enables a high-density plasma and high-etch rates to be achieved. In the plasma etcher 10, an inductive supply 22 and a bias supply 24 are used to generate the necessary plasma field. Multi-pole magnets 26 are used to hold the wafer 14 during the etching process. A wafer chuck 28 is used to hold the wafer 14 during the etching process. A ground 30 is provided to one end of the inductive coil 16.

In a typical inductively coupled RF plasma etcher 10 shown in FIG. 1, a source frequency of 13.56 MHZ and a wafer bias frequency of 13.56 MHZ are utilized. An ion density of approximately $0.5 \sim 2 \times 10^{12}$ cm$^3$ at wafer, an electron temperature of 3.5 to 6 eV and a chamber pressure of 1 to 25 m Torr are achieved or used.

In the typical plasma etch chamber 10, cooling means for uniformly cooling the wafer backside is provided in an E-chuck for controlling the wafer temperature during the plasma processing. This is shown in FIG. 2 for the plasma etcher 40. Although FIG. 2 is a schematic of cooling means for a wafer backside, other cooling means may be used, such as means described in U.S. Pat. No. 5,985,035 which is herein incorporated by reference.

In the conventional plasma etcher 40, E-chuck 42 is provided for supporting a wafer 44 thereon. E-chuck 42 can be constructed of either a metallic material or a polymeric material. A plurality of ventilation apertures (not shown) are provided in the E-chuck surface such that a cooling gas can be supplied to the backside 46 of the wafer 44 during plasma processing. The plurality of ventilation apertures in the E-chuck 42 is connected in fluid communication with a cooling gas inlet conduit 38 for feeding a cooling gas into the apertures. The cooling gas inlet conduit 38 is in turn connected to a gas supply line 36, a flow control valve 34 and a cooling gas supply 32. The pressure in the cooling gas supply line 36 is monitored by a pressure sensing device 48 which is in turn sends a signal 50 to a controller 52. The controller 52, after receiving signal 50 and comparing to a pre-stored value, sends signal 54 to the flow-control valve 34 for opening or closing the valve and thus increasing or decreasing the cooling gas supply through the supply line 36, 38 into the E-chuck 42. The amount of the cooling gas that is supplied to the E-chuck 42 is further adjusted by a needle valve 56 and pumped away by a pump 58. The assembly may further include a temperature feedback control system.

FIG. 3 illustrates a cross section of a conventional electrostatic chuck assembly 60 provided to hold a wafer 62 in position for processing within an apparatus such as a processing chamber of a CVD apparatus for forming a thin film on a semiconductor wafer or a dry etching apparatus for micromachining the wafer. The assembly 60 has a wafer holding member 64 that has a vertical peripheral wall 82 coated with a dielectric material 66, and a susceptor 68 integrally formed with the wafer holding member 64. The suscepter has a side wall 70 for restricting lateral movement of the wafer 62. There is a gap 72 between a backside 74 of the wafer 62 and the susceptor 68 wherein byproducts resulting from the wafer processing may be disposed within the gap 72 and thus, move the wafer 62 so that the wafer backside 74 is not substantially planar with the wafer holding member 64. A problem with existing ESC assemblies is that byproducts of the wafer etching process can flow to the backside of the wafer and thus cause cooling gas to be unevenly distributed to the wafer 62 backside and then cause deformation of the wafer 62. Overtime, the susceptor may wear due to contact with the plasma and the susceptor is difficult to clean.

FIG. 4-6 show another conventional electrostatic chuck assembly 60. FIG. 4 illustrates a cross section of the electrostatic chuck assembly 60 that has a non-tapered insert ring 76 juxtaposed between the susceptor 68 and the wafer holding member 64. The insert ring 76 has a vertical inner wall 78 and a vertical outer side wall 80 parallel to the susceptor side wall 70. However, as shown in FIG. 5, a gap 84 is often formed between the vertical inner wall 78 of the insert ring 76 and the vertical peripheral wall 82 (also shown in FIGS. 4 and 6) of the wafer holding member 64 when the insert ring 76 moves in a non-uniform manner relative to the wafer holding member 64. Thus, the insert ring 76 is not evenly distributed around the peripheral wall 82 of the wafer holding member 64 and a processing byproduct 75, as shown in FIG. 6, could still get between the backside 74 of the wafer and the wafer holding member 62 causing cooling gas to unevenly be distributed on the wafer backside 74 and thus deform the wafer. FIG. 5 illustrates a top view of the assembly 60 having the insert ring 76 and unwanted gap 84. FIG. 6 is an enlarged view of the assembly 60 showing the gap 84 and unwanted byproduct 75.

The leakage rate of plasma in the electrostatic chuck assembly 60 shown in FIGS. 4-5 can be 4 sccm and can seriously deteriorate the insert ring 76 after having a high frequency bias voltage flow through the ESC assembly 60 over time.

Therefore, it is desirable to provide an insert ring that acts as a protective cover for the peripheral wall of a wafer holding member that can be easily removed and replaced with another insert ring to keep the ESC assembly free from foreign substances to allow for easier wet cleaning of the ESC assembly.

It is desirable to have a leakproof seal formed between a wafer holding member and a removable insert ring to prevent byproduct from forming within an ESC assembly.

It is desirable to provide an improved ESC that prevents plasma leakage to the underside of a wafer.

It is desirable to provide an improved ESC that prevents uneven distribution of helium to a wafer backside after a dry etch process of PAD and VIA has run for several hours.

It is desirable to provide an improved ESC that will improve the uniformity of a PAD layer of the wafer and provide for a uniformity in the PAD layer of less than 3%.

It is desirable to provide an improved ESC assembly that reduces the preventative maintenance time required to clean an ESC assembly.

It is further desirable to provide a method of holding a wafer and a wafer holding system in which a cooling gas can be quickly dispersed over the back surface of a wafer when the cooling gas is introduced, after the wafer is electrostatically attracted, and wafer temperature control suitable for high productivity can be performed.

It is further desirable to improve the product yield of wafer etching and the availability of the wafer etching apparatus providing a wafer holding system which is subjected to a reduced amount of foreign substances as described above and is capable of performing uniform etching.

SUMMARY OF THE INVENTION

According to the present invention, there is provided an electrostatic chuck assembly for uniformly processing a wafer in a semiconductor wafer processing process, more particularly to prevent a byproduct formed from leakage of wafer processing materials from depositing between a wafer and the electrostatic chuck assembly.

The electrostatic chuck assembly has a wafer holding member for holding a wafer; a shadow ring in engagement with the wafer holding member; and an insert ring disposed between the shadow ring and the wafer holding member.

The wafer holding member has a wafer mounting surface and in a preferred embodiment has a conical head having a tapered peripheral wall and a cylindrical portion extending downwardly from the conical head. In another preferred embodiment, the wafer holding member is cylindrical and extends downwardly from the wafer mounting surface.

The insert ring prevents unwanted wafer processing byproducts from forming between the wafer mounting surface of the wafer holding member and a wafer. The insert ring has an inner wall for sealably engaging the wafer holding member. Preferably, the insert ring is removable to allow for easy cleaning of the electrostatic chuck assembly.

BRIEF DESCRIPTION OF THE DRAWINGS

These and other objects, features and advantages of the present invention will become apparent from the following detailed description and the appended drawings in which.

DETAILED DESCRIPTION OF THE DRAWINGS

Figure 1:
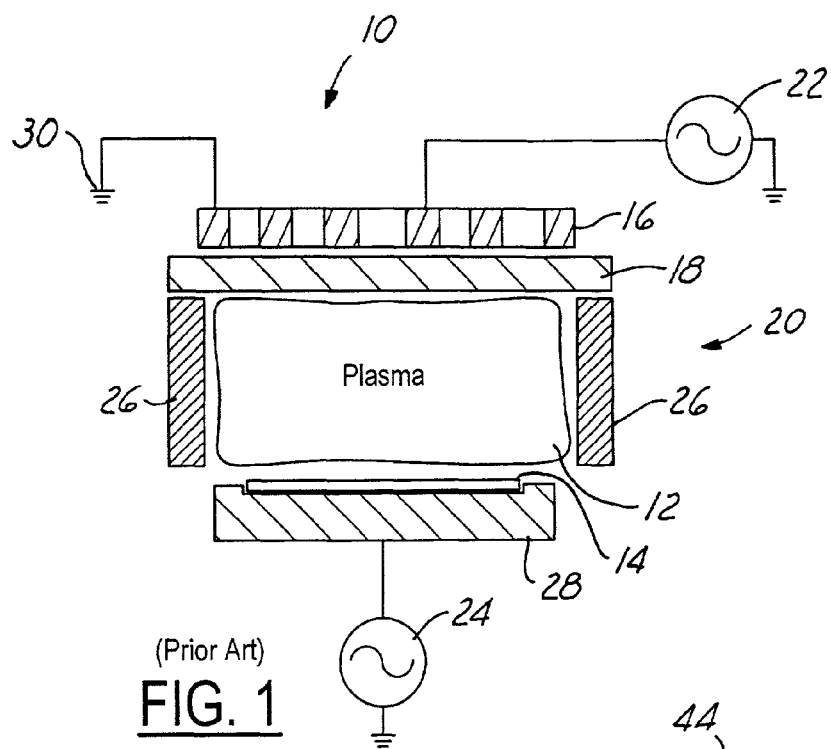
FIG. 1 is a schematic of a typical inductively coupled plasma etch chamber.
Figure 2:
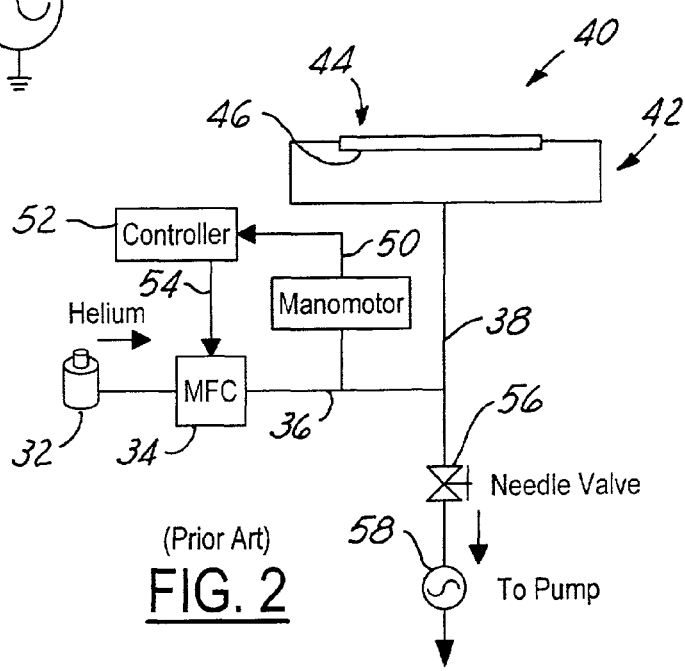
FIG. 2 is a schematic of cooling means for a wafer backside used in a wafer fabrication process.
Figure 3:
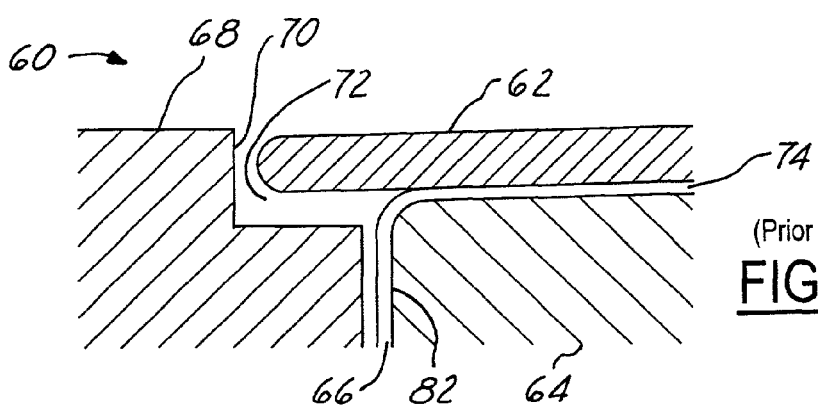
FIG. 3 illustrates a partial cross section of a conventional electrostatic chuck assembly.
Figure 4:
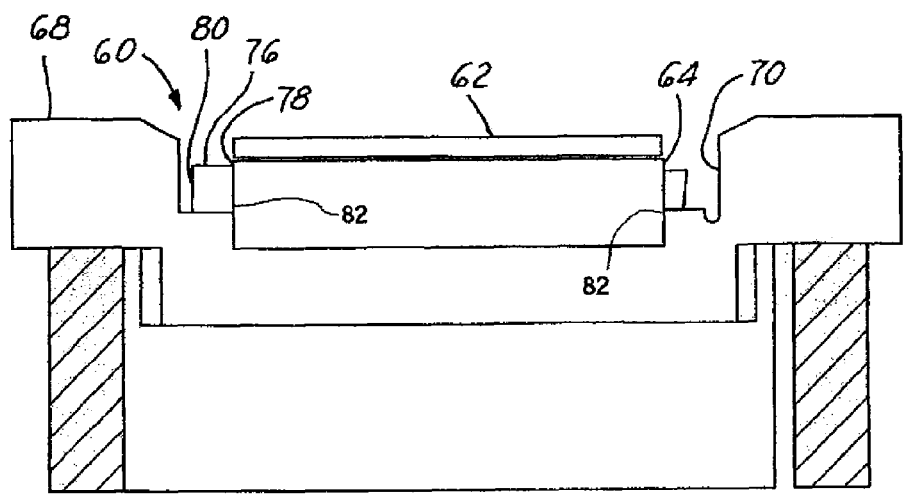
FIG. 4 illustrates a cross-section of another conventional electrostatic chuck assembly.
Figure 5:
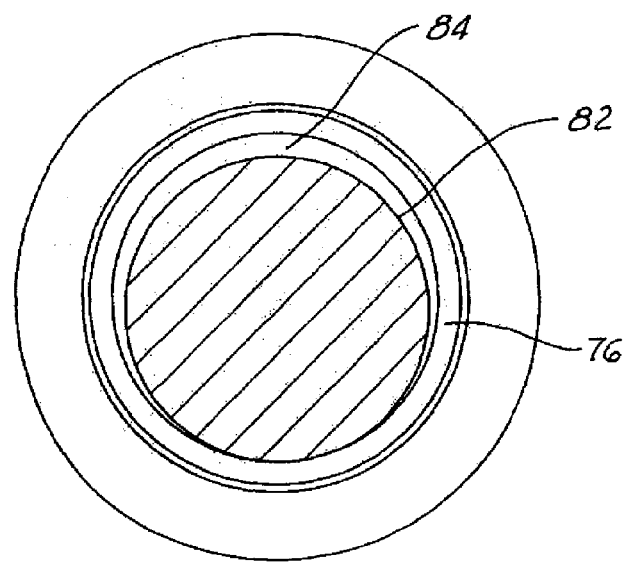
FIG. 5 illustrates a top view of a conventional electrostatic chuck assembly of FIG. 4 having an insert ring and an unwanted gap.
Figure 6:
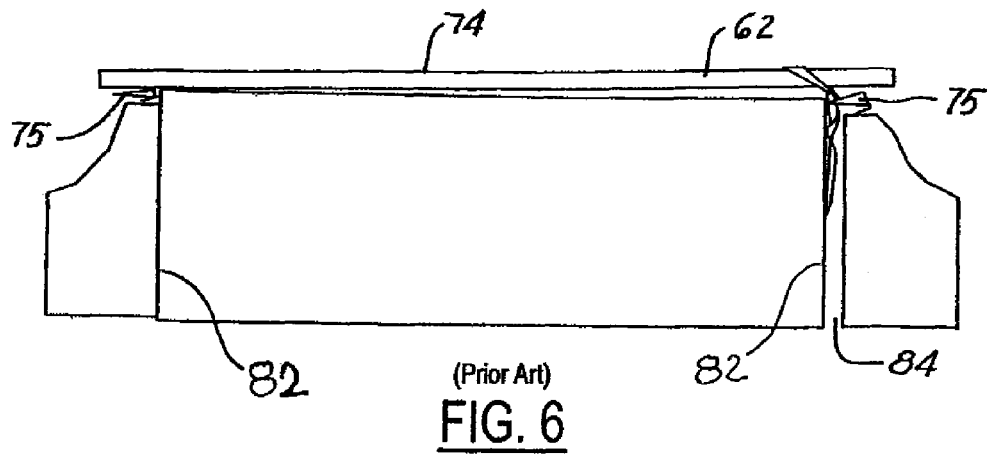
FIG. 6 is an enlarged view of the assembly of FIG. 4 showing an unwanted byproduct disposed within the conventional electrostatic chuck assembly.

Referring now generally to the drawings, FIGS. 1-10, the present invention discloses an electrostatic chuck assembly 86 for uniformly processing a wafer in a semiconductor wafer processing process, more particularly to prevent a byproduct formed from leakage of wafer processing materials between a wafer and the electrostatic chuck assembly. Referring to FIGS. 7-10, the electrostatic chuck assembly 86 of the present invention has a wafer holding member 94 for holding a wafer 88, a shadow ring 104 in engagement with the wafer holding member 94, and an insert ring 118 disposed between the shadow ring 104 and the wafer holding member 94.

The wafer holding member 94 has a mounting surface 98 for attracting and engaging the wafer 88 during processing of the wafer in a wafer fabrication process such as in a processing chamber of a CVD apparatus for forming a thin film on a semiconductor wafer, in a dry etching apparatus for micromachining the wafer, or for holding a glass substrate wafer for liquid crystal display or the like. Preferably, the mounting surface 98 is circular having a diameter less than a diameter of the wafer 88 to prevent protruding portions of the mounting surface 98 from extending beyond a peripheral edge 92 of the wafer 88 and from being exposed to etching reaction products.

The wafer mounting surface 98 is preferably a smooth flat surface and also, preferably, has a flat surface degree of not more than 500 μm so as to prevent invasion of a deposition gas such as etching reaction products to contact a backside 90 of the wafer 88. Etching is performed on a top surface 91 when the plasma is generated and thus, when etching gas and reaction products are flowing. Therefore, when there is a gap 134 between the back surface of the wafer 88 and the electrostatic chuck assembly 86, the etching gas and the reaction products enter into the gap 134 and are accumulated in the backside 90 of the wafer 88. They form foreign substances or deposition gas byproducts. This is not desirable, because the product yield of the etching process decreases. On the other hand, when the gap 134 between them is decreased so as to be as small as possible, the etching gas and the reaction products are decreased to enter the gap 134 and the byproducts accumulated on the backside 90 of the wafer 88 can be decreased.

Figure 7:
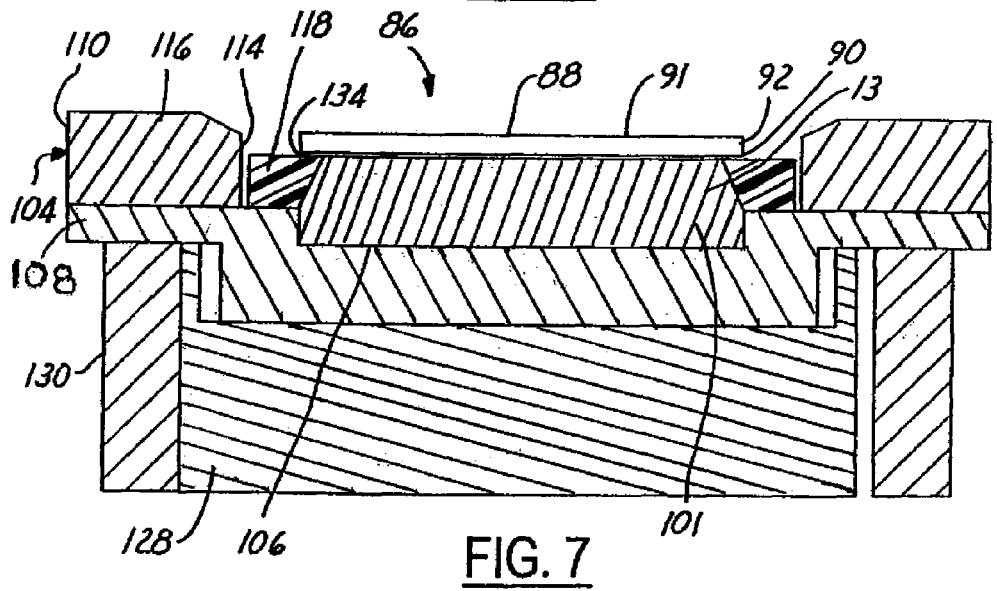
FIG. 7 illustrates a cross section of the electrostatic chuck assembly in accordance with the present invention.

The wafer holding member 94 is preferably made from a dielectric material such as alumina ceramic or aluminum nitride ceramics. However, the wafer holding member 94 may be made from a polymeric material or a conductive metallic material such as tungsten (W) or molybdenum (Mo) further having a dielectric layer forming the wafer mounting surface 98. The embodiment shown in FIG. 7 shows the wafer holding member 94 formed from a uniform dielectric material that does not have a separate dielectric layer. The wafer mounting surface 98 has a high endurance to repeated abrasion and deformation of more than 10,000 times caused by the electrostatic chucking of the wafer 88. The wafer mounting surface 98 is in communication with an ionization source described further below that operates to electrostatically adhere the backside 90 of the wafer 88 to the wafer holding member. Also, the wafer mounting surface is in communication with a conventional cooling means (not shown) as is well known in the processing arts as is described above. Preferably, a cooling gas is supplied to the wafer mounting surface 98, the cooling gas defining the cooling means. Helium is preferably used as the cooling gas because helium does not affect the etching characteristic when it leaks, and because the supplying or exhausting time for the cooling gas is shorter than for other gases. However, other gases, such as nitrogen, argon, and an etching gas may be used, although the cooling efficiency is changed. The cooling gas is not specially limited to these examples.

Figure 9:
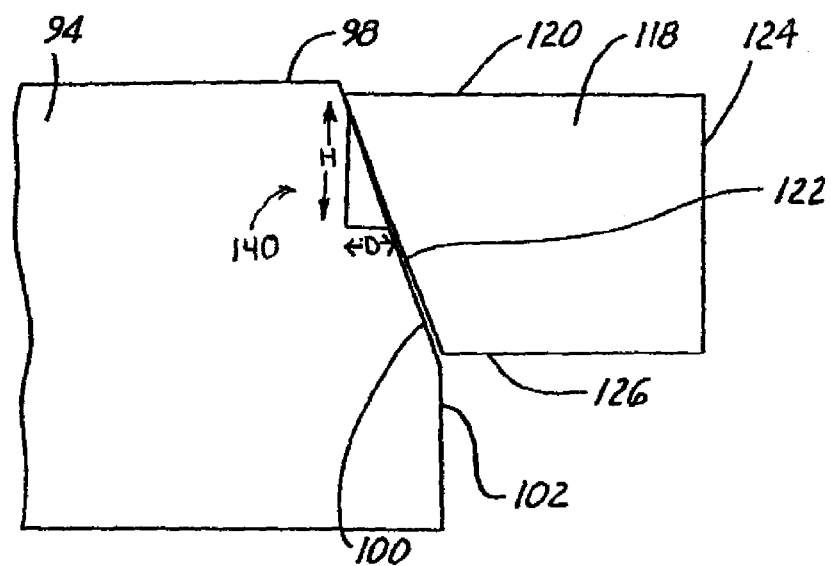
FIG. 9 illustrates an enlarged view of an insert ring engaging a tapered head of a wafer holding member.

Preferably, the wafer holding member 94 further has a conical shaped head 136 and a cylindrical portion 101 disposed beneath the conical head 136. The wafer holding member 94 further has a partially tapered peripheral wall 96 having a tapered portion 100 forming a periphery of the conical head 136 extending outwardly and downwardly for sealably engaging the insert ring 118, and a vertical portion 102 forming a periphery of the cylindrical portion 101 for engaging the shadow ring 104 as described further below. As is shown in FIG. 9, preferably, the tapered wall has a slope 140 having a depth D to height H ratio ranging from 1/2 to 1/100, more particularly, the tapered wall has a slope having a depth D to height H ratio ranging from 1/5 to 1/20.

As shown in FIG. 7, the shadow ring 104 has a recess 106 for receiving the wafer holding member 94, a flange 110 and a step portion 108 for supporting the insert ring 118 juxtaposed between the recess 106 and the flange 110. The shadow ring 104 serves as a cover for the wafer holding member 94 and prevents the wafer 88 from lateral movement beyond the flange 110. Preferably, the shadow ring 104 is made from a material such as quartz. The shadow ring 104 is positioned relative to the wafer 88 near the peripheral edge of the wafer 88 to cause a deposition gas flow of deposition gas for wafer etching to be uniform. The shadow ring 104 covers the cylindrical portion 101 of the wafer holding member 94.

The flange has an inner side wall 114, and a substantially planar upper surface 116. The inner side wall 114 of the flange 110 is preferably, perpendicular to the backside 90 of the wafer 88.

Although the reaction products (gas) produced by the deposition or etching gas and etching on a top surface of the wafer 88 is distributed in an approximately uniform density over the surface of the wafer, the etching characteristic in the peripheral edge 92 of the wafer 88 may be different from that in a central portion of the wafer 88 since in the outer peripheral portion of the wafer 88 the portion to produce the reaction products does not exist outside the wafer 88 and the flow boundary of gas flow abruptly changes. Therefore, in accordance with the present invention, the shadow ring 104 is placed approximately at the same level as the wafer 88 to prevent any abrupt change in the gas flow. The flow of the etching gas and the reaction products is directed slightly upward due to the existence of the substantially planar upper surface 116 of the flange 110. A stagnant effect of the etching gas and the reaction products takes place and causes a phenomena as if there is an etching reaction portion on the peripheral edge of the wafer 88. Therefore, etching is uniformly performed on the peripheral edge 92 of the wafer 88.

In addition to the above, there is an effect that, since the periphery edge 92 of the wafer 88 is in a state of being contained in the shadow ring 104 and the inner vertical side wall 114 of the flange 110 restricts the wafer 88 from shifting to any significant extent, it is possible to avoid the situation where the wafer 88 cannot be transported and a vacuum present in the etching chamber has to be broken even when an electrostatic adhering force is removed by some abnormal state and the wafer 88 is moved by the pressure of the helium gas supplied to the back surface of the wafer. At this time, the wafer 88 does not ride on the substantially planar portion 116 of the flange 110 even when the wafer 88 slides, because the inner side wall 114 facing the peripheral edge 92 of the wafer 88 is nearly vertical.

Figure 8:
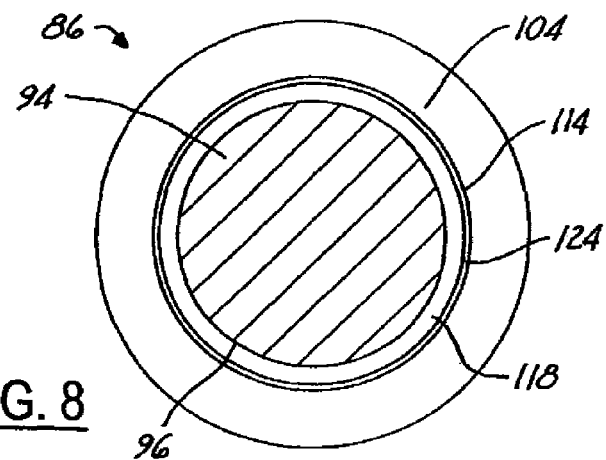
FIG. 8 illustrates a top view of the electrostatic chuck assembly in accordance with a preferred embodiment of the present invention.

As is shown in FIG. 7, preferably, the shadow ring 104 is in communication with a cathode 128 that cooperates to ionize the wafer holding member 94 when a high frequency bias voltage is applied to the cathode 128 as is well-known in the processing arts as described above. The cathode 128 is disposed beneath the shadow ring 104 and engages the shadow ring 104 to ionize the electrostatic chuck when the high frequency bias voltage is applied to the cathode. FIG. 8 illustrates a top view of the assembly 86 in accordance with the present invention.

As shown in FIG. 7, preferably, the shadow ring 104 is in further communication with an insulating member 130 formed of an electrically insulating material, such as alumina. The etching treatment is performed while applying a high frequency voltage to the wafer. At this time, there are some cases where an abnormal discharge takes place between the shadow ring 104 to which the high frequency voltage is directly applied from the cathode 128 and the wafer holding member 94. When the abnormal discharge occurs, the high frequency voltage is not correctly applied to the wafer 88, and the etching itself becomes abnormal. This is not limited to etching, but can be said generally of the type of wafer 88 treating apparatus in which plasma is generated using a high frequency voltage. In order to prevent such phenomena, in the electrostatic chuck assembly 86 according to the present invention, the wafer holding member 94, being at a different electric potential from the high frequency voltage applied portion, is specially isolated by inserting the insulating member 130. Thereby, the abnormal discharge can be prevented.

FIG. 9 further illustrates a cross section of the electrostatic chuck assembly 86 that has an insert ring 118 juxtaposed between the flange 110 of shadow ring 104 and the wafer holding member 94 to further reduce the gap 134, and to aid in preventing byproducts from forming within the gap 134. The insert ring 118 has a substantially planar top surface 120, a tapered inner side wall 122 complementary in shape to the tapered portion 100 of the peripheral wall 96 of the wafer holding member 94 for sealably engaging the tapered portion 100, an outer side wall 124, and a bottom surface 126 for engaging the recess 106 disposed within the step portion 108 of the shadow ring 104. Preferably, the insert ring 118 is removable to make the cleaning of the electrostatic chuck assembly easier. Preferably, the insert ring outer side wall 124 is parallel to and sealably engages the inner side wall 114 of the shadow ring flange 110. Also, preferably, the insert ring 118 is made from a flexible material such as silicon to allow for easy removal and replacement of the ring 118 so that the electrostatic chuck assembly can be cleaned.

As shown in FIG. 9, the distance from the wafer holding member mounting surface 98 to the insert ring top surface 120 ranges between 0.01 to 1 mm, preferably in the range of 0.05 to 0.3 mm. The insert ring 118 sealably engages the tapered chuck portion 100. The leakproof seal formed between the peripheral wall 96 of the wafer holding member 94 and the insert ring 118 prevents byproduct from forming between the wafer holding member mounting surface 98 and the backside 90 of the wafer 88.

Figure 10:
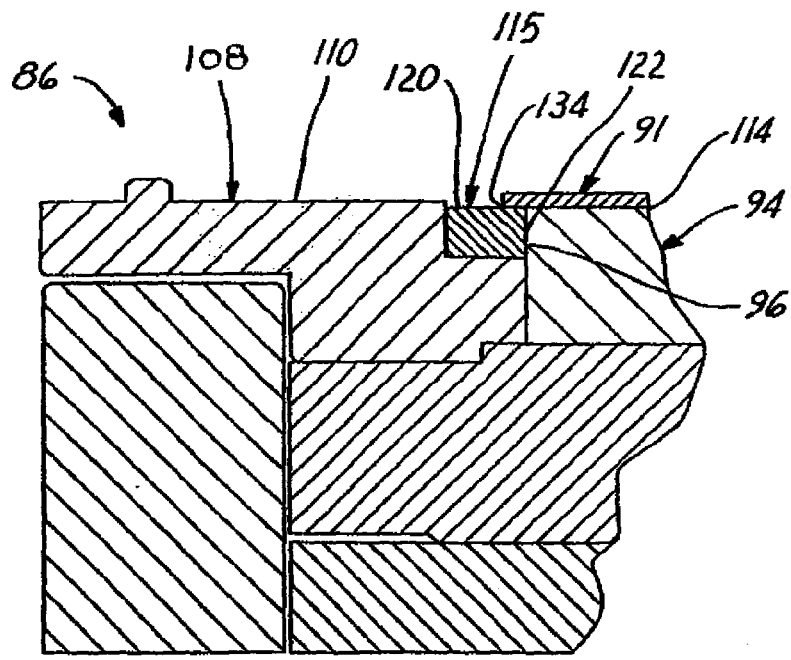
FIG. 10 illustrates a side cross sectional view of an electrostatic chuck assembly in accordance with another preferred embodiment of the present invention.

In an alternative embodiment as shown in FIG. 10, the electrostatic chuck assembly 86 is substantially the same as the assembly shown in FIGS. 7-9, however, the wafer holding member 94 is cylindrical, wherein the peripheral wall 96 of the wafer holding member 94 is vertical or perpendicular to the wafer backside 90 and the inner side wall 114 of the insert ring 118 is also vertical.

The leakage rate of deposition gas in the electrostatic chuck assembly 86 shown in FIGS. 7-10 can be 4 sccm and can seriously deteriorate the insert ring 118 over time, more particularly, after 60 hours of having a high frequency bias voltage flow (DC bias equals −400~−800 V; powers equals 0~3000 w and frequency equals 13.56 MHZ) through the electrostatic chuck assembly 86. Therefore, it is important to remove the insert ring 118 and clean the electrostatic chuck assembly to wash away the leaked byproducts and then replace the insert ring 118. However, wet cleaning the assembly 86 is time consuming and can slow down the wafer product yield each time the assembly is cleaned.

As described above, the elements of a highly reliable electrostatic chuck assembly has been explained.

What is claimed is:

1. An electrostatic chuck assembly for uniformly processing a wafer comprising:
    a wafer holding member for holding a wafer having a conical shaped head and a cylindrical portion disposed beneath the conical head;
    a shadow ring in engagement with the wafer holding member; and
    an insert ring disposed between the shadow ring and the wafer holding member.

2. The electrostatic chuck assembly of claim 1 wherein the wafer holding member comprises:
    a mounting surface for attracting and engaging the wafer during processing of the wafer in a wafer fabrication process; and
    a peripheral wall.

3. The electrostatic chuck assembly of claim 2 wherein the wafer holding member peripheral wall further comprises:
    a tapered portion forming a periphery of the conical head extending outwardly and downwardly for sealably engaging the insert ring, and
    a vertical portion forming a periphery of the cylindrical portion for engaging the shadow ring.

4. The electrostatic chuck assembly of claim 2 wherein the wafer holding member further is cylindrical.

5. The electrostatic chuck assembly of claim 1 wherein the shadow ring comprises:
    a recess for receiving and covering the wafer holding member;
    a flange extending upwardly from a step portion; and
    a step portion for supporting the insert ring juxtaposed between the recess and the flange.

6. The electrostatic chuck assembly of claim 5 wherein the shadow ring further comprises quartz.

7. The electrostatic chuck assembly of claim 6 wherein the flange of the shadow ring flange comprises:
   an inner side wall perpendicular to a backside of the wafer, and
   a substantially planar upper surface.

8. The electrostatic chuck assembly of claim 7 wherein the shadow ring is in communication with a cathode, the cathode disposed beneath and engaging the shadow ring, and is in further communication with an insulating member.

9. The electrostatic chuck assembly of claim 2 wherein the insert ring comprises:
   a substantially planar top surface;
   an inner side wall complementary in shape to the peripheral wall of the wafer holding member for sealably engaging the peripheral wall of the holding member;
   an outer side wall; and
   a bottom surface for engaging the shadow ring.

10. The electrostatic chuck assembly of claim 9 wherein the insert ring is removable.

11. An electrostatic chuck assembly for uniformly processing a wafer comprising:
   a wafer holding member for holding a wafer having a conical shaped head and a cylindrical portion disposed beneath the conical head;
   a shadow ring in engagement with the wafer holding member; and
   an insert ring disposed between the shadow ring and the wafer holding member, the insert ring having
      a substantially planar top surface,
      an angled inner side wall complementary in shape to the conical shaped head of the wafer holding member for sealably engaging the conical shaped head of the wafer holding member,
      an outer side wall, and
      a bottom surface for engaging the shadow ring.

12. The electrostatic chuck assembly of claim 11 wherein the wafer holding member further comprises:
   a mounting surface for attracting and engaging the wafer during processing of the wafer in a wafer fabrication process; and
   a peripheral wall having
      a tapered portion forming a periphery of the conical head extending outwardly and downwardly for sealably engaging the insert ring, the tapered portion having, a slope ranging from 1/2 to 1/100, and
   a vertical portion forming a periphery of the cylindrical portion for engaging the shadow ring.

13. The electrostatic chuck assembly of claim 11 wherein the shadow ring comprises:
   a recess for receiving and covering the wafer holding member;
   a flange extending upwardly from the step portion having an inner side wall perpendicular to a backside of the wafer, and
   a substantially planar upper surface; and
   a step portion for supporting the insert ring juxtaposed between the recess and the flange.

14. The electrostatic chuck assembly of claim 13 wherein the shadow ring is in communication with a cathode, the cathode disposed beneath and engaging the shadow ring, and is in further communication with an insulating member.

15. An electrostatic chuck assembly of claim 11 wherein the insert ring is removable and comprises silicon.

\* \* \* \* \*